(12) United States Patent
Hsu et al.

(10) Patent No.: US 7,983,069 B2
(45) Date of Patent: Jul. 19, 2011

(54) WRITE OPERATIONS FOR PHASE-CHANGE-MATERIAL MEMORY

(75) Inventors: Louis L. C. Hsu, Fishkill, NY (US); Brian L. Ji, Fishkill, NY (US); Chung Hon Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/146,128

(22) Filed: Jun. 25, 2008

(65) Prior Publication Data

US 2008/0253177 A1 Oct. 16, 2008

Related U.S. Application Data

(63) Continuation of application No. 11/193,878, filed on Jul. 29, 2005, now Pat. No. 7,460,389.

(51) Int. Cl.
*G11C 11/00* (2006.01)
*G11C 7/00* (2006.01)
(52) U.S. Cl. .................. 365/148; 365/163; 365/194
(58) Field of Classification Search .......... 365/148, 365/158, 163, 171, 173, 194
See application file for complete search history.

(56) References Cited

U.S. PATENT DOCUMENTS

| 5,296,716 | A | 3/1994 | Ovshinsky et al. |
| 6,768,665 | B2 * | 7/2004 | Parkinson et al. ............ 365/163 |
| 6,885,602 | B2 | 4/2005 | Cho et al. |
| 7,242,605 | B2 * | 7/2007 | Choi et al. ................... 365/163 |
| 7,304,885 | B2 * | 12/2007 | Cho et al. ...................... 365/163 |

* cited by examiner

*Primary Examiner* — Trong Phan
(74) *Attorney, Agent, or Firm* — Vazken Alexanian; Ryan, Mason & Lewis, LLP

(57) ABSTRACT

Improved write operation techniques for use in phase-change-material (PCM) memory devices are disclosed. By way of one example, a method of performing a write operation in a phase-change-material memory cell, the memory cell having a set phase and a reset phase associated therewith, comprises the following steps. A word-line associated with the memory cell is monitored. Performance of a write operation to the memory cell for the set phase is initiated when the word-line is activated. The write operation to the memory cell for the set phase may then be continued when valid data for the set phase is available. A write operation to the memory cell for the reset phase may be performed when valid data for the reset phase is available. Other improved PCM write operation techniques are disclosed.

12 Claims, 6 Drawing Sheets

WRITE OPERATIONS FOR PHASE-CHANGE-MATERIAL MEMORY

CROSS-REFERENCE TO RELATED APPLICATION(S)

The application is a continuation of U.S. application Ser. No. 11/193,878 filed on Jul. 29, 2005, now issued as U.S. Pat. No. 7,460,389, the disclosure of which is incorporated herein by reference.

FIELD OF THE INVENTION

The present invention relates generally to memory devices and, more particularly, to phase-change-material memory devices.

BACKGROUND OF THE INVENTION

Random access memory (RAM) such as static RAM (SRAM) and dynamic RAM (DRAM) are widely used in computation and communication systems today. Both SRAM and DRAM are volatile memories that lose data when the power is turned off. As mobile computing and communication systems become popular, intensive research and development in the memory area is now focusing on new non-volatile memories. A promising new non-volatile memory is based on phase-change-materials or PCM (such as, by way of example, Chalcogenide) by using its resistance changes in ordered (crystal, conductive) and disordered (amorphous, resistive) phases.

Although the PCM memory appears to be faster than traditional non-volatile technology such as FLASH, today's state of the art PCM prototypes are still much slower in speed than SRAM and DRAM. Specifically, for PCM RAM, the random access cycle time is limited by the write operation to the PCM system, which is much slower than the read operation. Also, the writing speeds for the binary "1"s and "0"s are quite asymmetric. Because the forming of the crystal state can be significantly slower than the forming of the amorphous state, the time required to form the "set phase" (denoted herein as write-"0" operation) is significantly longer than that for the "reset phase" (denoted herein as write-"1" operation).

Accordingly, a need exists for improved write operation techniques in PCM memory devices.

SUMMARY OF THE INVENTION

The above discussed and other drawbacks and deficiencies of the prior art are overcome or alleviated by improved write operation techniques for use in phase-change-material (PCM) memory devices.

In one aspect of the invention, a method of performing a write operation in a phase-change-material memory cell, the memory cell having a set phase and a reset phase associated therewith, comprises the following steps. A word-line associated with the memory cell is monitored. Performance of a write operation to the memory cell for the set phase is initiated when the word-line is activated. The write operation to the memory cell for the set phase may then be continued when valid data for the set phase is available. A write operation to the memory cell for the reset phase may be performed when valid data for the reset phase is available.

In another aspect of the invention, a method of performing a write operation in a phase-change-material memory cell, the memory cell having a set phase and a reset phase associated therewith, comprises the following steps. It is determined that valid data for the reset phase is available. Performance of a write operation to the memory cell for the reset phase is delayed for a given amount of time. The write operation to the memory cell for the reset phase may be performed within a time period for performance of a write operation to the memory cell for the set phase.

In yet another aspect of the invention, a method of performing a burst write operation in a phase-change-material memory array comprising multiple memory cells, each memory cell having a set phase and a reset phase associated therewith, comprises the following steps. A word-line associated with multiple bit-lines corresponding to the multiple memory cells is monitored. Performances of write operations to the multiple memory cells for the set phase are initiated when the word-line is activated. Further, it is determined that valid data for the reset phase is available. Performances of write operations to the multiple memory cells for the reset phase are delayed for a given amount of time.

In a further aspect of the invention, a method of performing a write operation in a phase-change-material memory cell comprises the following steps. A read operation is performed in accordance with the memory cell. A write operation for the memory cell is performed when the memory cell stores data having a value opposite to a value of input data.

In one embodiment, valid data for the set phase is a data value equivalent to about zero and valid data for the reset phase is a data value equivalent to about one. In another embodiment, valid data for the set phase is a data value equivalent to about one and valid data for the reset phase is a data value equivalent to about zero.

In still a further aspect of the invention, a write driver circuit for use with a phase-change-material memory array comprises a set phase write driver circuit for selectively connecting a bit line to a set current source, wherein the set phase write driver circuit is selectable via a set phase write control signal and the level of the set current source is controllable via mirroring from a set phase bias voltage source. The write driver circuit for use with a phase-change-material memory array also comprises a reset phase write driver circuit for selectively connecting a bit line to a reset current source, wherein the reset phase write driver circuit is selectable by a reset phase write control signal and the level of the reset current source is controllable via mirroring from a reset phase bias voltage source.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
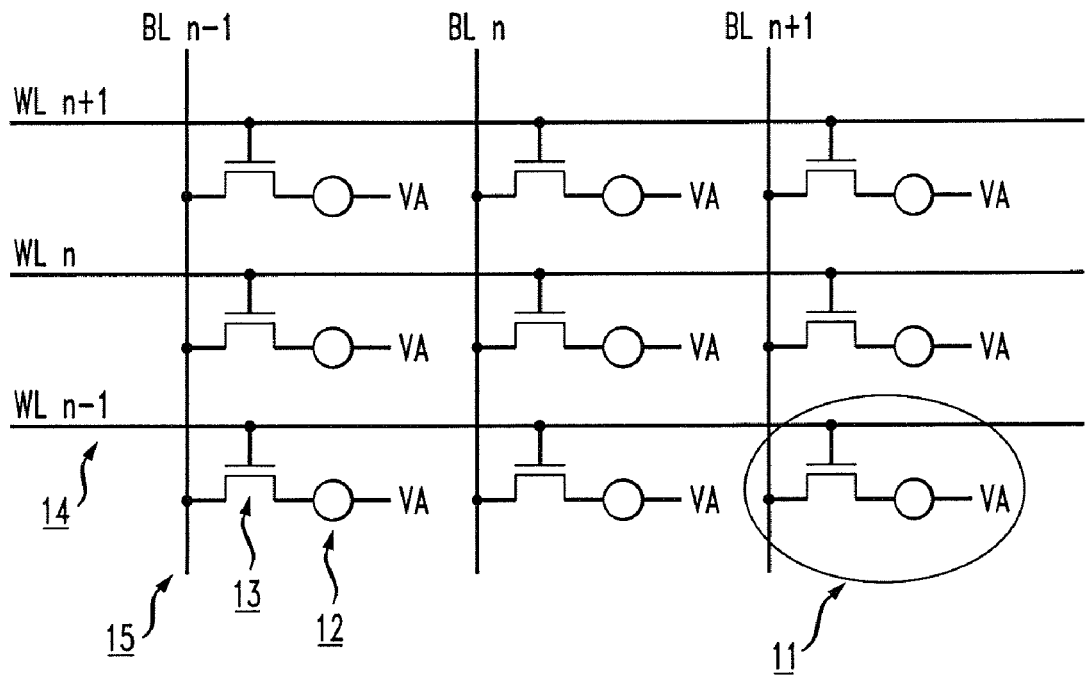
FIG. 1 is a diagram illustrating a PCM RAM array.

Principles of the invention provide improved write operation techniques for use in a PCM RAM system, such as may be implemented in one or more integrated circuits. As will be evident, several illustrative write methods will be described for high speed, high bandwidth, and/or power efficient PCM RAM systems. A burst write method will also be illustratively described for high performance, high density PCM RAM.

One method is referred to as "speculative set", where a write for the "set" phase is performed as soon as the word-line is activated. When the data input is available at a later time, the write for "set" phase continues if the data input is "0", or it changes to write for "reset" phase if the data input is "1".

For the convenience of discussion herein, the "1" and "0" are denoted to correspond to the "reset" and "set" phases, respectively. This is the denotation used in Table 1 below. However, it is to be understood that this denotation is arbitrary, i.e., set phase could be a write-"1" operation and reset phase could be a write-"0" operation. Nonetheless, it is to be understood that the set state, whether referring to a write-"0" operation or a write-"1" operation, corresponds to the crystalline phase associated with PCM. Likewise, it is to be understood that the reset state, whether referring to a write-"0" operation or a write-"1" operation, corresponds to the amorphous phase associated with PCM.

Another method is referred to as "scheduled reset", where a write for the "reset" phase for a particular bit-line may be delayed or scheduled to a later time. This provides flexibility to reduce peak power since write for the amorphous (reset) phase requires the highest current.

Another method is referred to as "burst-write mode", which is a combination of "speculative set" and "scheduled reset". In this combination mode, data inputs are provided in a burst manner, allowing a wide page width system with a small number of input-output pins.

Yet another write method that achieves low power consumption involves a "read-before-write" operation. In such case, after a read operation, the write operation is performed only for those cells that store data having a value opposite to the data input.

Non-volatile memory using phase change materials, such as Chalcogenides, is disclosed in U.S. Pat. No. 5,296,716. The term "Chalcogen" refers to the Group VI elements of the periodic table. Chalcogenide refers to materials containing at least one of these elements such as the alloy of germanium, antimony, and tellurium, etc. The Chalcogenide phase change material, e.g., $Ge_2Sb_2Te_5$, can be programmed and reprogrammed into a large range of resistance states.

In PCM-based memory, data programming is achieved through thermally induced structural phase changes when electrical pulses are applied to the Chalcogenide resistors. In the write operation, a high current, short pulse will lead to the amorphous phase (or so called "reset" state) with high resistance. A lower and longer current pulse will lead to the crystalline phase with low resistance (or called low resistance "set" state). Read operation is performed with an even lower current that does not cause any phase change. The ratio between the resistance values of two states can be greater than 1,000 times, which provides a high sensing margin.

By way of further example, U.S. Pat. No. 6,885,602 discloses that in a write operation, when a current is applied to the PCM to generate a temperature greater than or equal to its melting temperature and then the PCM is rapidly cooled down, the PCM becomes amorphous and data '1' may be recorded in the PCM. In this case, the PCM is said to have entered a "reset" state. If the PCM is heated at a temperature greater than or equal to a crystallization temperature, maintained for a given time, and cooled down, the PCM becomes crystalline and data '0' may be recorded in the PCM. In this case, the PCM is said to have entered a "set" state. When an external current is applied to the PCM, a resistance of the PCM changes. When the resistance of the PCM changes, a voltage changes, thus allowing the expression of binary values '1' and '0'. In a read operation, a bit-line and a word-line may be selected to choose a particular memory cell.

FIG. 1 shows an implementation of a phase change material (PCM) random access memory (RAM) array 10, which is an array of PCM RAM cells 11. The array comprises a plurality of word-lines and a plurality of bit-lines, and a two dimensional matrix of cells. A PCM-RAM cell 11 comprises: (1) a phase change material 12, represented by a small circle, with one end connected to a voltage source VA; (2) a n-type field effect transistor (nFET) 13 that has its gate connected to the word-line (WL) 14 and its source and drain connected to the bit-line (BL) 15 and the phase change material 12, respectively. Only one word-line in the array is activated in the write and read operations. In the write operation, electric current pulses are driven along the bit-lines to program 1s and 0s, based on the pulse strength and length. In the read operation, a current pulse lower than a threshold level (for phase change) is sent along the bit-line, and a sense amplifier is used.

Figure 2:
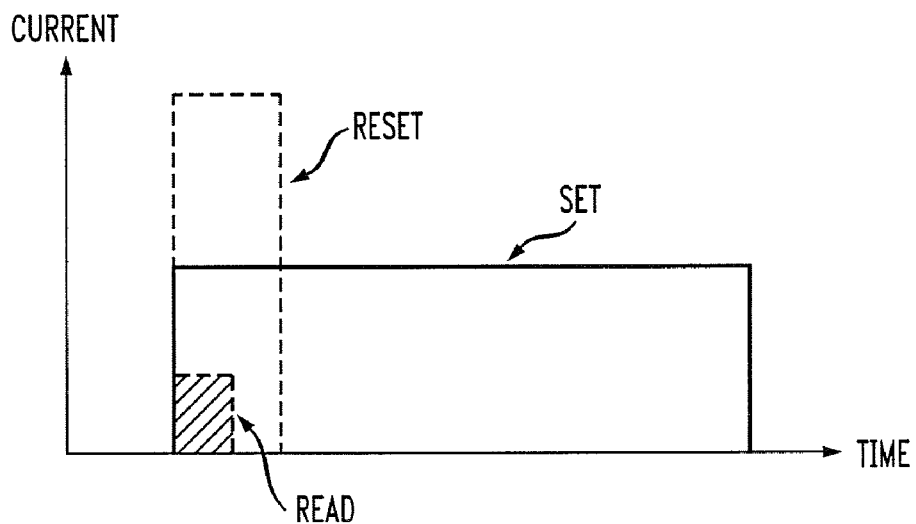
FIG. 2 is a diagram illustrating current characteristics for read and write operations.

As shown in FIG. 2, the write operation requires higher current and also takes longer time than the read operation. Also, the writing speeds for the binary "1"s and "0"s are quite asymmetric. Because of the forming of the crystal state can be significantly slower than the forming of the amorphous state, the time required to form the "set phase" (denoted as write-"0") is significantly longer than that for the "reset phase" (denoted as write-"1"). On the other hand, the write current magnitude required for "reset" is significantly higher than that required for "set". The required strength and time duration (length) for the current pulse are summarized in Table 1.

TABLE 1

Current characteristics for write and read operations.

| | word-line | data input | current pulse length | current pulse strength | state written | data output |
|---|---|---|---|---|---|---|
| Write 1 | high | 1 | $t_{reset}$ | $I_{reset}$ | amorphous (high R) | — |
| Write 0 | high | 0 | $t_{set}$ | $I_{set}$ | crystal (low R) | — |
| Read | high | — | $t_{read}$ | $I_{read}$ | | 1/0 |

For the convenience of discussion herein, "1" is denoted by the reset state (high resistance) and "0" is denoted by the set state (low resistance). The time duration (length) and strength of the current pulse for reset, set and read are given by equations (1) and (2), respectively:

$$t_{set} > t_{reset} > t_{read} \quad (1)$$

$$I_{reset} > I_{set} > I_{read} \quad (2)$$

Exemplary values are shown below in Table 2.

TABLE 2

Exemplary write and read current and timing parameters

| $t_{reset}$ | $t_{set}$ | $t_{read}$ |
|---|---|---|
| ~10 ns | ~100 ns | ~3 ns |
| $I_{reset}$ | $I_{set}$ | $I_{read}$ |
| ~100 uA | ~50 uA | ~10 uA |

Therefore, as compared to the conventional random access memory (RAM) where writing 1s and 0s is symmetric, the writing of 1s and 0s for the PCM RAM is quite different in both the time duration and power consumption. In the sections below, several improved write methods are provided. Such methods take advantage of these asymmetric characteristics for speed and power optimization.

A. "Speculative Set" for High Speed Write Operation

Figure 3:
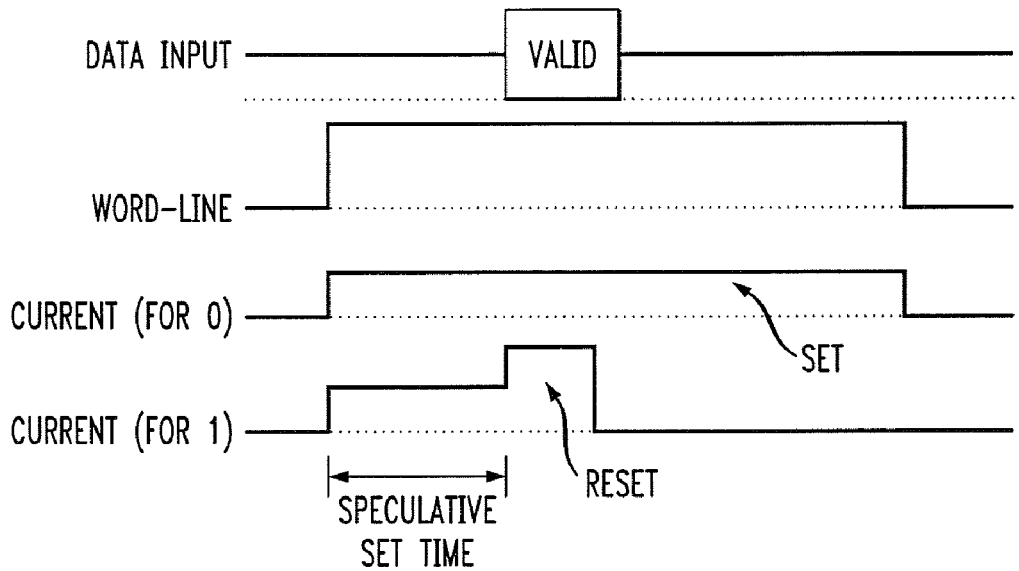
FIG. 3 is a diagram illustrating a write operation, according to a first embodiment of the invention.

In the conventional RAM, the write operation would start after the valid data input is received. For PCM RAM, "write 0" takes a longer time, thus it is beneficial to start it earlier. As shown in FIG. 3, high write speed is achieved by a "speculative set". Note that this is possible due to the thermodynamic nature of "reset" (i.e., write-"1"), write-"1" is possible after such speculative write-"0".

As shown in FIG. 3, as soon as the word-line is activated, a "speculative set" write-"0" operation is started. After the valid data input is received, if the data to write is "0", the set operation continues and a "0" will be written to the PCM cell; if the data to write is "1", a higher current will be turned on and "reset" operation starts. This approach completes the write operation faster than the conventional method by saving the time from word-line activation to valid data-input. As will be shown below, this approach is particular efficient in a burst write mode.

B. "Scheduled Reset" for Power Management

Figure 4:
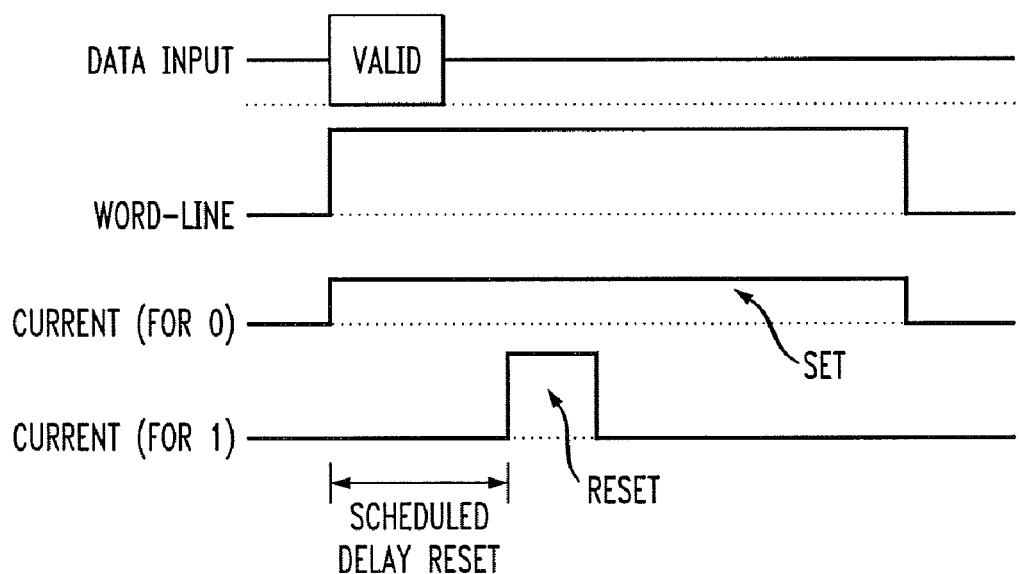
FIG. 4 is a diagram illustrating a write operation, according to a second embodiment of the invention.

FIG. 4 shows the timing diagram for a "scheduled delay reset" write operation. Since write-"1" operations (i.e., reset) take higher current and much shorter time, it is beneficial to distribute them to achieve more uniform power. There is no penalty on speed as long as they are scheduled within the required time for write-"0" operations (i.e., set).

Figure 5A:
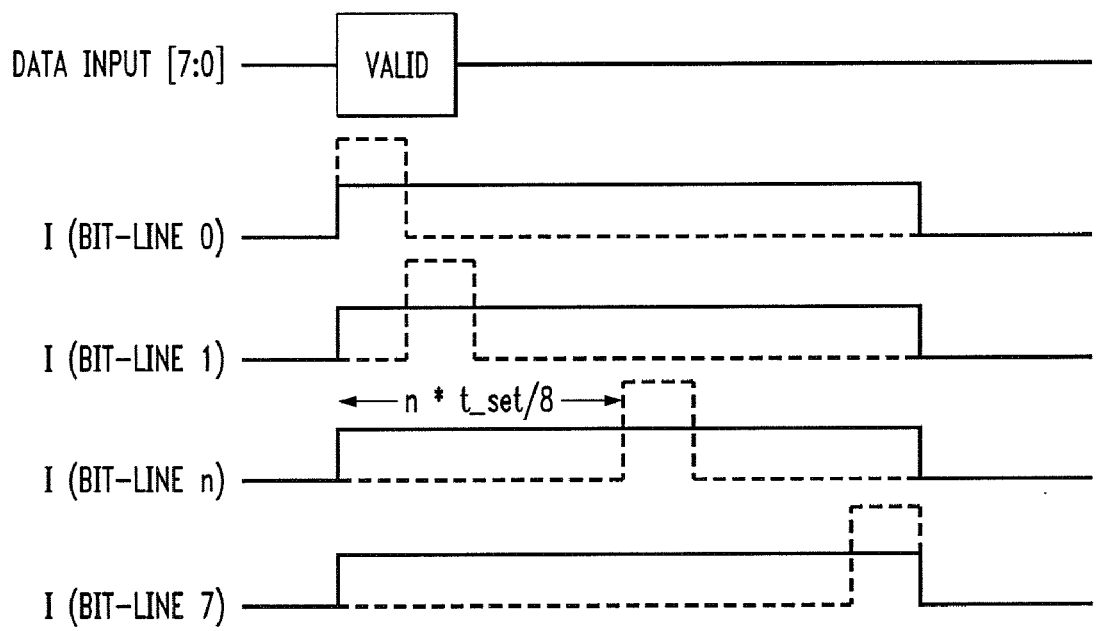
FIG. 5A is a diagram illustrating an example associated with the write operation of the second embodiment.

FIG. 5A shows an exemplary scheduling where bit-line number 8k+n, where n=0, 1, 2, . . . , 7, data input [7:0] are delayed by a time interval that equals to (n*$t_{set}$/8). I_bit-line shown is the current pulse for a bit-line. Note that write 1 (reset) is represented by the dashed line and write 0 (set) is represented by the solid line.

Figure 5B:
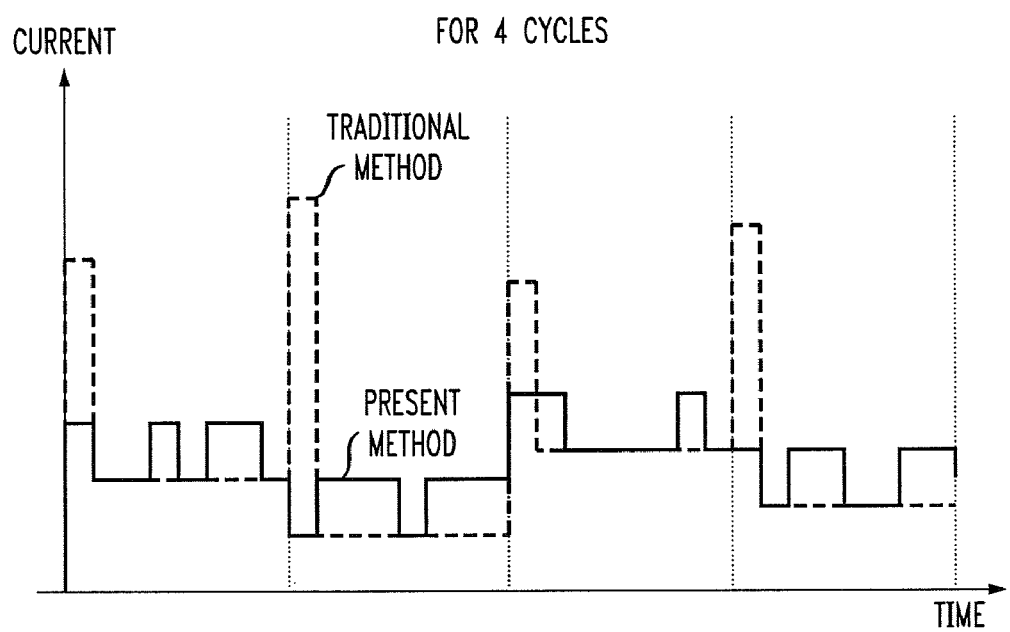
FIG. 5B is a diagram illustrating an example associated with the write operation of the second embodiment.

FIG. 5B shows the power consumption comparison between the traditional (depicted as dotted line) and this present "scheduled reset" system (depicted as solid line). It illustrates the reduction of peak power and also more uniform power consumption.

C. "Burst Write Mode" for High Bandwidth and Narrower Inputs/Outputs

A multi-bit burst write approach is possible by a combination of "speculative set" and "scheduled reset", which also leads to a smaller number of data inputs/outputs (IOs). The factor for the reduction of the number of data IOs is equal to the number of the burst bits. For example, a 128-bit wide system can be implemented with 32 data IOs with a 4-bit burst mode.

Figure 6:
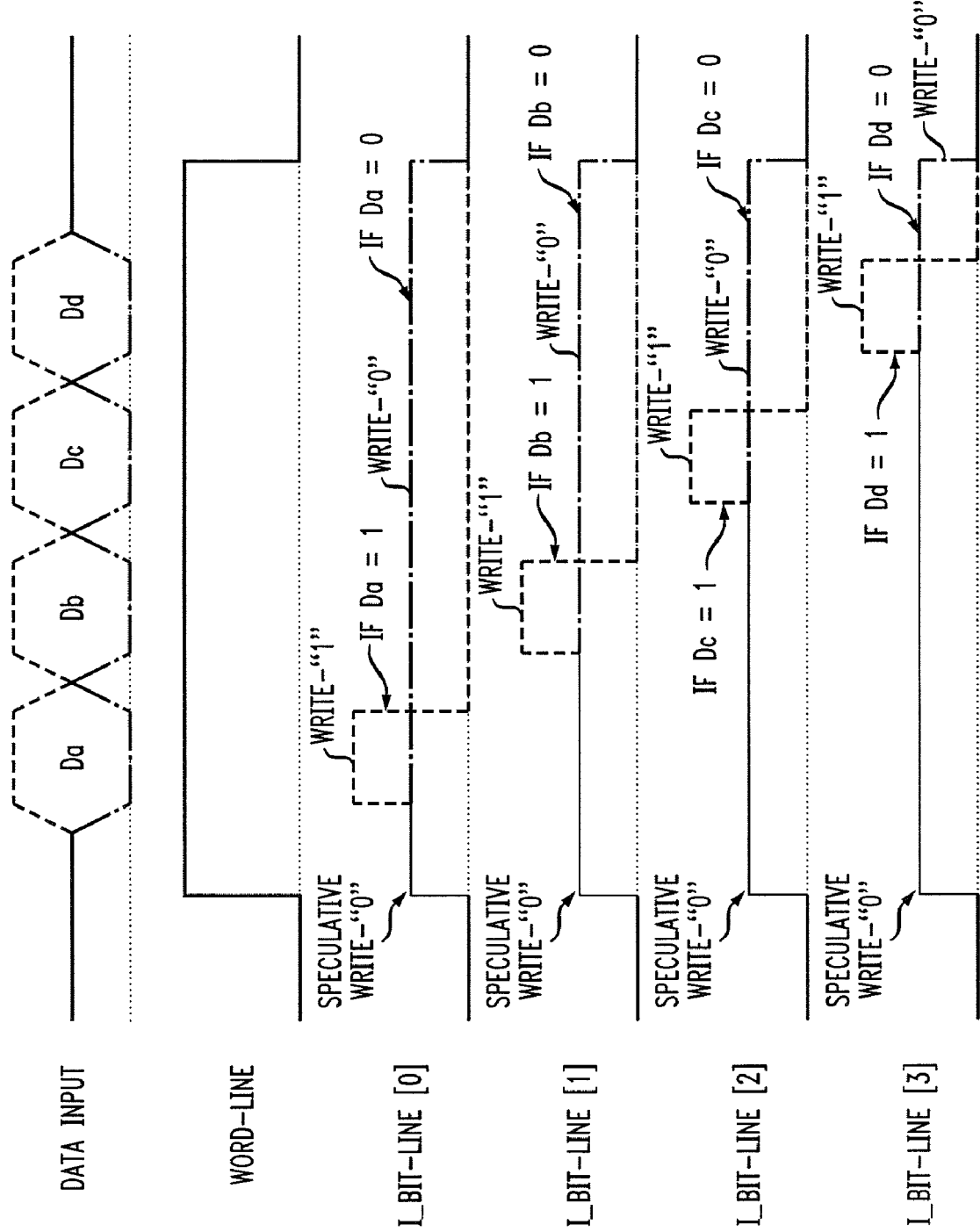
FIG. 6 is a diagram illustrating a write operation, according to a third embodiment of the invention.

FIG. 6 shows the timing diagram for a "4-bit burst" write operation. Here I_bitline [0, 1, 2, 3] represent the current pulse on a group of 4 bit-lines. The solid line is the speculative write-"0", the dotted line is for write-"1", and the dashed/dotted line is for write-"0". The input data is sent in a 4-bit burst mode (Da, Db, Dc, Dd). Once the data is valid, it is decided whether the data will follow the write-"1" line path (dotted) or the write-"0" line path (dashed/dotted). Although four bits of data sharing a data input port arrived in time sequence, the writings are completed at the same time. The total word-line activation time is equal to the "write 0" (i.e., set) time plus a margin. Thus, there is no speed degradation compared to the conventional method.

D. "Read-Before-Write" for Lower Power Consumption

Figure 7:
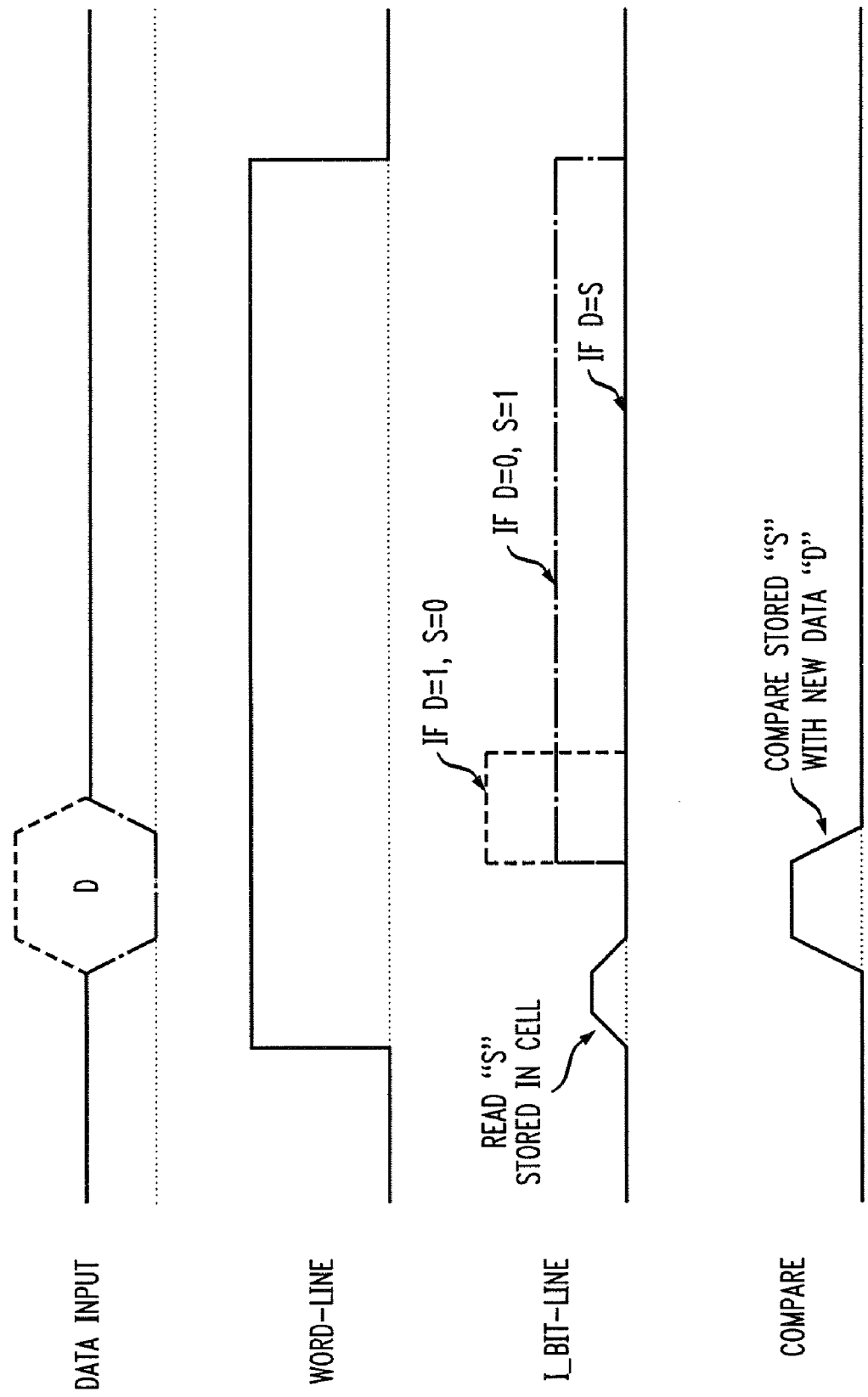
FIG. 7 is a diagram illustrating a read operation, according to an embodiment of the invention.

Since a read is low power and high speed, a read operation may be performed prior to every write operation. The write operation is executed only for those cells that store opposite data as compared to the data input (i.e., compare stored data "S" with new data "D" to see if D=1 and S=0; if D=0 and S=1; write operation is not executed if D=S). FIG. 7 shows the timing diagram for this technique. The dotted line denote write-"1" and the dashed/dotted line denotes write-"0".

E. Illustrative Implementation of the Read/Write Buffer/Driver

Figure 8:
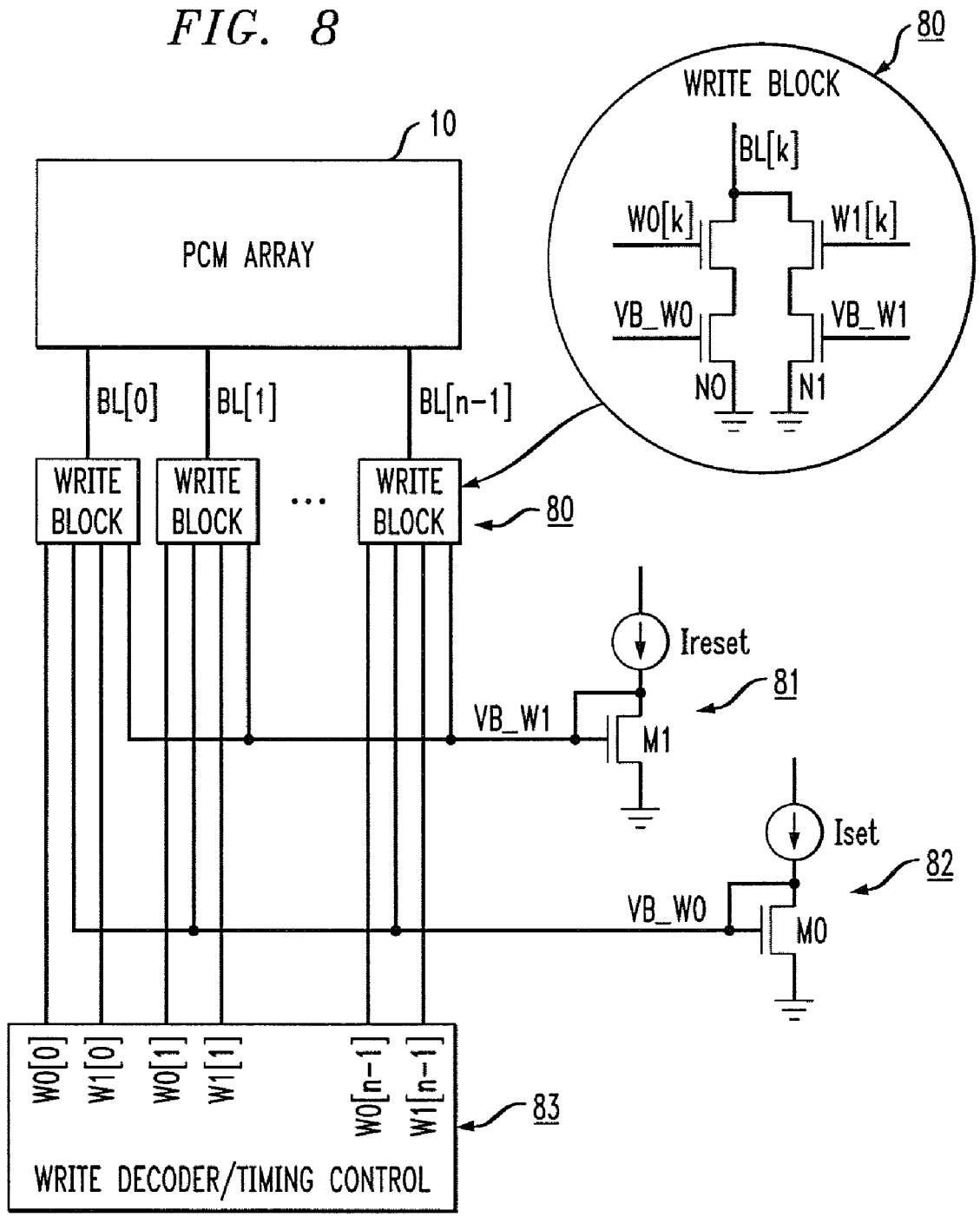
FIG. 8 is a diagram illustrating write driver circuitry, according to an embodiment of the invention.

FIG. 8 shows a sample implementation of write driver circuitry where a common set of bias voltages corresponding to the set and reset are generated and used in all read/write buffers.

As shown, each write block 80 is connected to the set of bias voltage sources 81 and 82. One example of a write block that may be employed is represented by the encircled circuitry shown in the upper right hand corner of FIG. 8. Further, a column decoder/write timing control block 83 sets the gates W0[k] and W1[k] (timing control signal for writing "0" and writing "1", respectively) and VB_W0 and VB_W1 (respective signals for write-"0" and write-"1" programming current level) for bit-line k, which controls the current pulses sent to the bit-lines (BL[0] . . . BL[n-1]) so that the timing requirements discussed above in sections A to D are achieved.

More particularly as shown, each bit-line, BL(i) where i=0 to n-1, from PCM array 10 is connected to a write block 80. The schematic of the write block is enclosed in the circle also labeled 80. The write block is basically a multiplexer switch which connects a bit line to a set current source (Iset) or reset current source (Ireset) depending on whether the control signal W0[k] or W1[k] is selected.

For writing "0" on a bit-line BL[k], the W0[k] is selected and enabled for a predetermined period of time which is needed for the set operation. At this moment, the tail device N0 is mirroring current from a diode device M0 via net VB_W0 which provides an appropriate amount of current to perform the set operation. In other words, the control signal W0[k] controls the pulse width while device N0, which is biased by the gate voltage at net VB_W0, controls the pulse height of the set programming current.

On the other hand, for writing "1" on the same bit-line BL[k], the W1[k] is selected and enabled for another predetermined period of time needed for the reset operation. At this moment, the tail device N1 is mirroring current from a diode device M1 via net VB_W1 which provides an appropriate amount of current to perform the reset operation. In other words, the control signal W1[k] controls the pulse width while device N1, which is biased by the gate voltage at net VB_W1, controls the pulse height of the reset programming current.

The write decoder/timing control block 83 performs the decoding operation to choose when and which bit-line(s) to be activated for a set or reset operation. Note that set and reset operations are mutually exclusive from each bit-line but can be performed simultaneously at different bit-lines. This control block controls timing of each bit line so that it can perform speculative set, scheduled reset or burst operation, as described above.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of performing a write operation in a phase-change-material memory cell, the memory cell having a set phase and a reset phase associated therewith, the method comprising the steps of:
   monitoring a word-line associated with the memory cell;
   initiating performance of the write operation to the memory cell for the set phase, wherein initiation occurs upon activation of the word-line and before valid data for the set or reset phase is available;
   continuing the performance of the write operation to the memory cell for the set phase when valid data for the set phase is available; and
   changing from the performance of the write operation to the memory cell for the set phase to performance of the write operation to the memory cell for the reset phase when valid data for the reset phase is available.

2. The method of claim 1, wherein valid data for the set phase is a data value equivalent to about zero and valid data for the reset phase is a data value equivalent to about one.

3. The method of claim 1, wherein valid data for the set phase is a data value equivalent to about one and valid data for the reset phase is a data value equivalent to about zero.

4. The method of claim 1, wherein the changing step comprises increasing a current being applied to the memory cell.

5. A method of performing a write operation in a phase-change-material memory cell, the memory cell having a set phase and a reset phase associated therewith, the method comprising the steps of:
   determining that valid data for the reset phase is available; and
   intentionally delaying initiation of performance of the write operation to the memory cell for the reset phase for a given amount of time, upon determination that valid data for the reset phase is available;
   wherein the write operation to the memory cell for the reset phase is performed within a time period for performance of the write operation to the memory cell for the set phase.

6. The method of claim 5, wherein valid data for the set phase is a data value equivalent to about zero and valid data for the reset phase is a data value equivalent to about one.

7. The method of claim 5, wherein valid data for the set phase is a data value equivalent to about one and valid data for the reset phase is a data value equivalent to about zero.

8. The method of claim 5, wherein the memory cell is one of a plurality of memory cells, and wherein write operations to respective ones of the plurality of memory cells for the reset phase are performed within a time period for performance of the write operation to the memory cell for the set phase.

9. A method of performing a burst operation in a phase-change-material memory array comprising multiple memory cells, each memory cell having a set phase and a reset phase associated therewith, the method comprising the steps of:
   monitoring a word-line associated with multiple bit-lines corresponding to the multiple memory cells;
   initiating performance of the write operations to the multiple memory cells for the set phase, wherein initiation occurs upon activation of the word-line and before valid data for the set or reset phase is available;
   continuing performance of the write operations to the corresponding memory cells for the set phase when valid data for the set phase is available; and
   changing from the performance of the write operation to the memory cell for the set phase to performance of the write operation to the memory cell for the reset phase when valid data for the reset phase is available, the changing step comprising the steps of:
   intentionally delaying initiation of performance of the write operations to the multiple memory cells for the reset phase for a given amount of time, upon determination that valid data for the reset phase is available; and
   performing the write operations to the memory cells for the reset phase within a time period for performance of the write operations to the corresponding memory cells for the set phase.

10. The method of claim 9, wherein valid data for the set phase is a data value equivalent to about zero and valid data for the reset phase is a data value equivalent to about one.

11. The method of claim 9, wherein valid data for the set phase is a data value equivalent to about one and valid data for the reset phase is a data value equivalent to about zero.

12. The method of claim 9, wherein the changing step comprises increasing a current being applied to the memory cell.

* * * * *